(12) United States Patent
Mirow

(10) Patent No.: US 8,098,107 B2
(45) Date of Patent: Jan. 17, 2012

(54) VOLTAGE/CURRENT REGULATOR SYSTEM USING CONSTANT LOOP GAIN

(76) Inventor: Fred Mirow, Lower Merion, PA (US)

( * ) Notice: Subject to any disclaimer, the term of this patent is extended or adjusted under 35 U.S.C. 154(b) by 42 days.

(21) Appl. No.: 12/584,462

(22) Filed: Sep. 5, 2009

(65) Prior Publication Data

US 2010/0060371 A1 Mar. 11, 2010

Related U.S. Application Data

(60) Provisional application No. 61/191,180, filed on Sep. 6, 2008.

(51) Int. Cl.
*H03L 1/00* (2006.01)

(52) U.S. Cl. ....... 331/175; 331/183; 331/185; 331/36 C; 331/36 L

(58) Field of Classification Search ................... 331/175, 331/183, 185, 36 C, 36 L
See application file for complete search history.

(56) References Cited

U.S. PATENT DOCUMENTS 7,276,863 B2 * 10/2007 Lee et al. ...................... 315/307
7,863,989 B2 * 1/2011 Orberk et al. .................. 331/15

* cited by examiner

*Primary Examiner* — Arnold Kinkead

(57) ABSTRACT

A system for providing voltage and current regulator sources based on a oscillator having variable loop gain is described. Only when the oscillator loop gain is at least the value of one does the oscillator oscillate. The oscillator's ability to oscillate is controlled by the one or more variable impedance or gain devices. Negative feedback of the voltage or current output level is used to control the loop gain of the oscillator circuit.

9 Claims, 4 Drawing Sheets

VOLTAGE/CURRENT REGULATOR SYSTEM USING CONSTANT LOOP GAIN

CROSS-REFERENCE TO RELATED APPLICATIONS

The benefits of filing this invention as the following listed Provisional application for patents by Fred Mirow are claimed: 61/191,180; VOLTAGE/CURRENT REGULATOR SYSTEM USING CONSTANT LOOP GAIN. FILING DATE Sep. 6, 2008.

BACKGROUND OF THE INVENTION

This invention relates generally to electronic regulator circuits and, more particularly, to voltage and current regulator sources capable of providing an output signal level which is insensitive to temperature variations, radiation, and to variations in the input voltage supplied to the regulator circuit.

Stable voltage and current regulators are required to power circuits such as A/D converters, and measurement devices to name only a few. In addition current regulator are useful for controlling motors.

Most electronic regulators use a zener or bandgap to develop the reference voltage. These references depend on semiconductor properties that are useful over limited temperature range, and radiation levels. Fred Mirow in U.S. Pat. No. 7,456,700 titled "VARIABLE LOOP GAIN OSCILLATOR SYSTEM" described a technique that maintained the oscillator loop gain at unity to develop a stable voltage reference.

Accordingly, one of the objects of the invention is to provide electronic regulators which are insensitive to temperature variations, radiation, and to variations in the input voltage supplied to the regulator circuit.

An other objective is to provide voltage and current regulator systems that have high temperature, radiation, and voltage stability due to its reliance on component ratios to set circuit thresholds operating values.

It is an additional object of the invention to provide electronic regulator circuits that are less susceptible to process variances by relying on impedance ratios thereby providing a more consistently manufacturable circuit.

BRIEF SUMMARY OF THE INVENTION

Embodiments of the present invention meet these and other needs. Embodiments of this invention, use one or more signal level controlled variable impedance or variable gain devices along with other elements to form an oscillator.

Oscillators consist of a feedback network section combined with an amplifier section. The feedback network is connected to the input and output of the amplifier so as to provide positive feedback and be capable of oscillating. The amplifier has a phase shift of about 0 degrees and the feedback network supplies the remaining phase shift necessary to make the total phase shift at the frequency of oscillation 0 degrees. If the amplifier is phase inverting having a phase shift of about −180 degrees, than the feedback network would provide the required phase shift amount to have 0 degrees total. This oscillator will only oscillate when the loop gain of the amplifier and feedback network is at least one and the phase shift is zero. There are many well-known phase shift networks that can be used as part of feedback network such as the twin T and the Wien Bridge. In addition well known resonate feedback circuits consisting of inductor capacitor networks may be used.

The amplifier section has a high temperature and voltage stability due to its reliance on component ratios to set circuit thresholds operating values. Negative feedback networks can be used in the amplifier section to increase phase and gain stability against the effects of temperature and voltage and to accurately set the amplifier section's gain. The negative feedback is optimally obtained by using a divider network in which the divider network element's temperature and voltage characteristics are matched. The effects of temperature on the divider network are then decreased. This also decreases the effects on the amplifier section since the divider network primarily determines the gain of it.

The oscillator's feedback network can also use circuits that depend on the ratio of circuit components, including capacitors, inductors, and resistors, to provide stable gain over temperature.

There are many well-known methods for implementing oscillator signal controlled gain varying elements. One method is to use signal controlled variable impedance devices. Some examples for use with a voltage input signal are variable resistors obtained by using a FET with its gate connected to input. An other approach is a variable capacitor type using a reverse biased semiconductor junction such as a diode. As the DC voltage across the diode is varied its capacitance also varies. Also a current input signal can be applied by using as one example a variable inductor obtained by using a core of magnetic material which uses the current through the inductor to vary it's inductance. In addition the temperature variation of a resistor can be used to control the resistance of the resistor. These resistors are known as Resistance Temperature Detectors (RTD) and also thermistors.

Likewise there are many well known methods for obtaining signal controlled variable gain devices. An example of this is transistors. The transistor's gain is varied by varying its DC operating current level in response to input thus obtaining a signal controlled variable gain device. Also, the inductive coupling (mutual inductance) between inductors may be changed in response to an input signal.

The detector output is determined by the oscillator state. When the oscillator is oscillating an AC signal is present and when not oscillating, no AC signal is present. The detector input provides the desired type of output signal to the output control input. When used as part of a linear regulator the detector output signal is proportional to the AC input signal level. When used as part of a switching regulator the detector output signal is high or low depending on whether the oscillator is oscillating or not.

The output control uses transistors, or in the case switching regulator transistors, or relays to control the voltage or current output level supplied to the load from the external power source. The level of the detector output signal controls the level of turn on of a device such as a transistor, or the duty cycle of switching elements being transistors, or relays.

The output control output is used to control the voltage or current level at the regulator output. This output voltage or current level controls a gain-varying element in the oscillator which is used to control the oscillator's loop gain. As the output control output level varies the output voltage or current varies causing the loop gain to vary. In linear regulators the detector output control output level is of a value that just maintains oscillation by keeping the loop gain value at or very close to one. Switching regulators have the detector output level go high or low depending on whether the oscillator is oscillating or not. The regulator output signal level therefore remains a substantially constant DC voltage or current output signal level.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Figure 1:
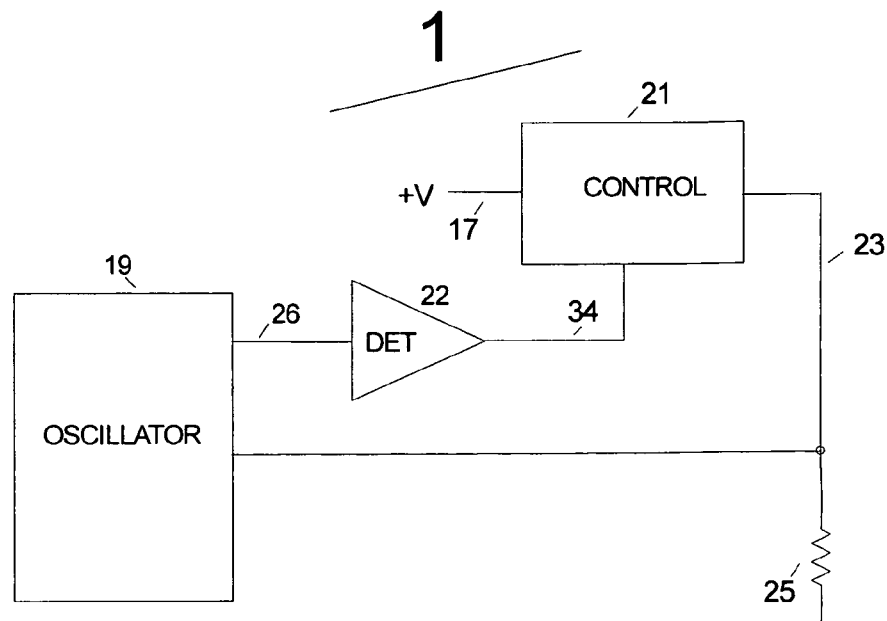
FIG. 1 shows a block diagram of voltage regulator system 1.

An embodiment of the invention is shown in FIG. 1. The voltage regulator system 1 comprising oscillator 19, voltage control 21, detector 22 and load resistor 25. Oscillator 19 receives an gain control input signal on line 23 which is also connected to load resistor 25. The output of oscillator 19 on line 26 is connected to the detector 22 input. The output signal of detector 22 on line 34 is connected to the control input of output control 21. Output control 21 has its other input on line 17 connected to the supply voltage and its output connected to line 23.

Detector 22 output level is responsive to the oscillation signal level of oscillator 19 on line 26 and its output on line 34 is used to control the output control 21 output voltage level on line 23. The voltage level on line 23 controls the loop gain of oscillator 19. As the voltage level on line 23 increases the loop gain of oscillator 19 is reduced below the value of one causing the oscillation to stop and the detector 22 output signal is reduced to zero turning off output control 21 causing the voltage level on line 23 to become zero.

In effect the voltage level on line 23 is applied as negative feedback to maintain a relatively low AC signal level on line 26 which occurs at a loop gain value at or very close to one. This causes the voltage level on line 23 to remain substantially at a value that just maintains oscillation. The output control 21 output voltage level therefore remains substantially a constant DC value.

Figure 2:
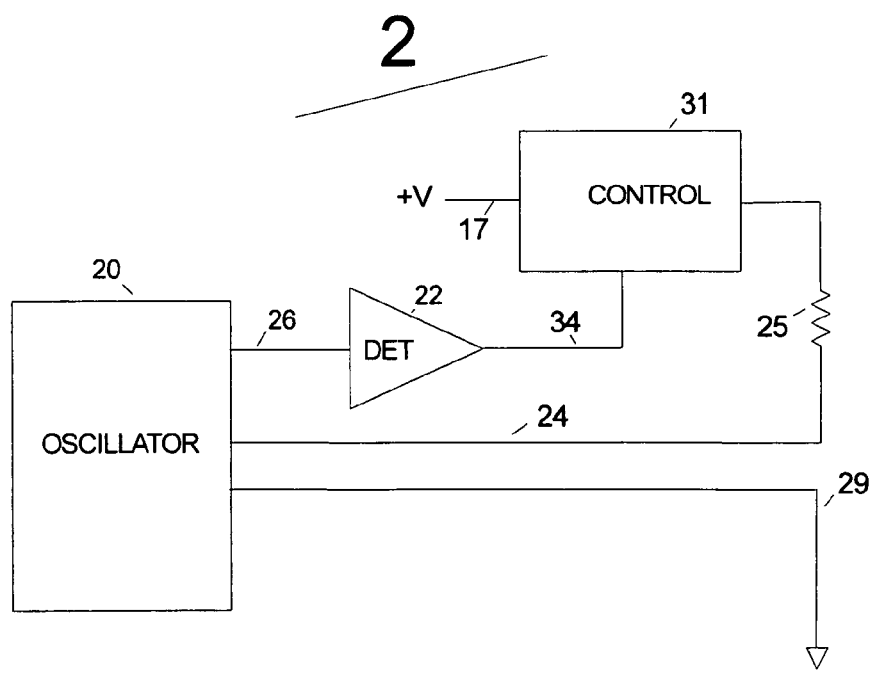
FIG. 2 shows a block diagram of current regulator system 2.

An other embodiment of the invention is shown in FIG. 2. The current regulator system 2 comprising oscillator 20, output control 31, detector 22, and load resistor 25. Load resistor 25 connects the output of output control 31 to line 24. Oscillator 20 receives to input signal as a current flowing in on line 24 and out on line 29. The other end of line 29 is connected to ground. The output of oscillator 20 on line 26 is connected to the detector 22 input. The output signal of detector 22 on line 34 is connected to the control input of output control 31. Output control 31 has its other input on line 17 connected to the supply voltage.

Detector 22 output level is responsive to the oscillation signal level of oscillator 20 on line 26 and its output on line 34 is used to control the output control 31 output current level to line 24. The current level on line 24 controls the loop gain of oscillator 20. As the current level on line 24 increases the loop gain of oscillator 20 is reduced below the value of one causing the oscillation to stop and the detector 22 output signal is reduced to zero turning off output control 31 causing the current level on line 24 to become zero.

In effect the current level flowing on line 24 to line 29 is applied as negative feedback to maintain a relatively low AC signal level on line 26 which occurs at a loop gain value at or very close to one. The current level flowing on line 24 to line 29 is of a value that just maintains oscillation. The output control 31 output current level flowing on line 24 to line 29 therefore remains substantially a constant value.

Figure 3:
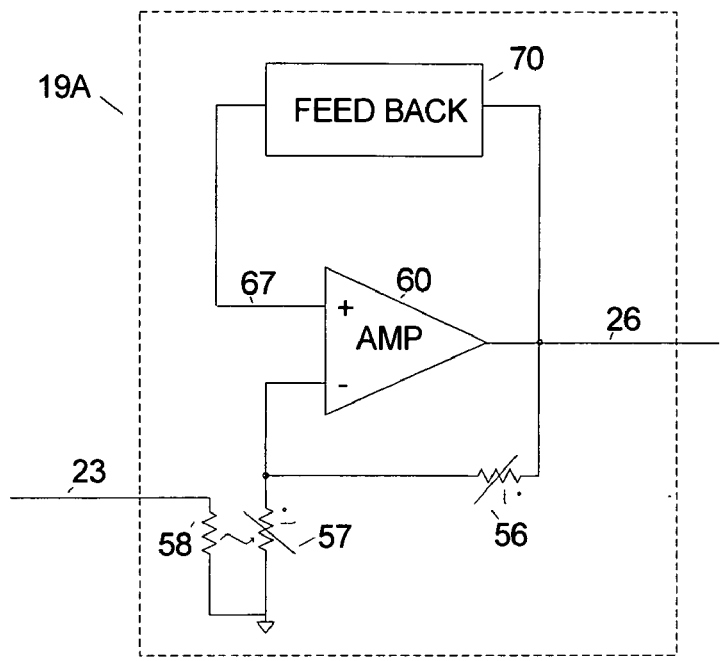
FIG. 3 shows a block diagram of oscillator 19A using resistor gain control of voltage regulator system 1.

FIG. 3 shows a block diagram of oscillator 19A which uses variable resistors for gain control. Oscillator 19A is formed by connecting the output of amplifier 60 on line 26 to feedback network 70 and also to one end of variable resistor 56. The output of feedback network 70 is connected by line 67 to the non-inverting input of amplifier 60. The inverting input of amplifier 60 is connected to variable resistor 56 and variable resistor 57. The other end of variable resistor 57 is connected to ground. Resistor 58 is thermally coupled to variable resistor 57. Resistor 58 is connected between line 23 and ground.

Feedback network 70 is frequency selective and provides a substantially fixed signal gain at a given frequency between the input and output of the amplifier 60 so as to provide positive feedback. The negative feedback network consist of variable resistor 56 and variable resistor 57. The negative feedback signal gain is controlled by the ratio of variable resistor 56 to variable resistor 57. Variable resistor 56 and variable resistor 57 have substantially matching temperature coefficients and are at substantially the same ambient temperature level. It is understood that instead of variable resistor 56 being used a fixed value resistor could be used with reduced temperature coefficients matching.

The resistance value of variable resistor 57 is controlled by the temperature of resistor 58. The voltage level of on line 23 causes the temperature of resistor 58 to increase above it's ambient temperature. As the temperature of resistor 58 increases the resistance of variable resistor 57 changes. In this example the resistance of variable resistor 57 increases with increasing temperature causing the level of negative feedback to increase. Since variable resistor 56 and variable resistor 57 have substantially matching temperature coefficients the effects of ambient temperature change have substantially no effect on the level of negative feedback. If variable resistor 56 and variable resistor 57 resistance values decrease with temperature, resistor 58 would be thermally coupled to variable resistor 56 to increase the level of negative feedback as resistor 58 temperature increased.

Figure 4:
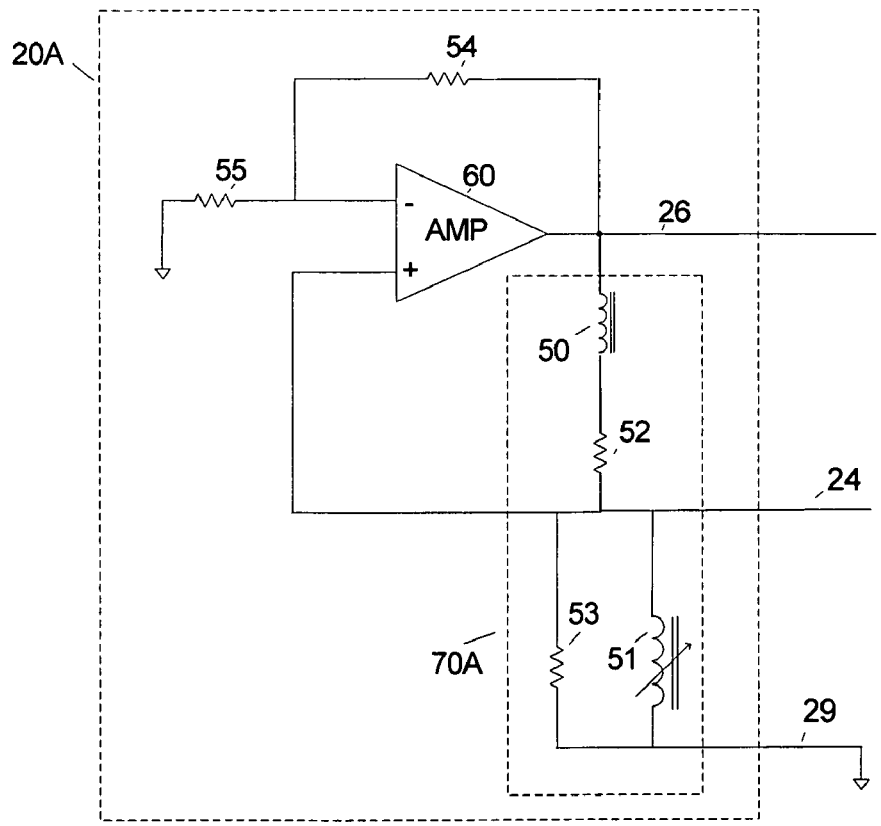
FIG. 4 shows a block diagram of oscillator 20A using inductor gain control of current regulator system 2.

FIG. 4 shows a block diagram of oscillator 20A which uses a variable inductor for gain control. Oscillator 20A is formed by connecting the output of amplifier 60 on line 26 to feedback network 70A and also to one end of resistor 54. The output of feedback network 70A is connected by line 24 to the non-inverting input of amplifier 60. The inverting input of amplifier 60 is connected to resistor 54 and resistor 55. The other end of resistor 55 is connected to ground.

The negative feedback network consist of resistor 54 and resistor 55. The negative signal level gain is controlled by the ratio of resistor 54 to resistor 55. Resistor 54 and resistor 55 have substantially matching temperature coefficients.

Feedback network 70A is formed by connecting one end of inductor 50 to line 26 and the other end to resistor 52. The other end of resistor 52 is connected to line 24, variable inductor 51 and to resistor 53. The other end variable inductor 51 and resistor 53 are connected to line 29 which is also connected to ground. Inductor 50 and variable inductor 51 have substantially matching temperature coefficients. It is understood that instead of using fixed value inductor 50 a variable value inductor could be used with increased temperature coefficients matching.

Feedback network 70A is frequency selective and also provides a variable signal level gain between the input and output of the amplifier 60 so as to provide positive feedback.

The variable inductor 51 inductance level is controlled by the level of current flowing on line 24 to line 29. Variable inductor 51 has a much lower DC impedance level than other components connected to line 24 so that substantially all the DC current on line 24 flow's through it. The variable inductor 51 magnetic core material "μ" decreases as primary current increases causing it's inductance level to decrease. As the current flowing on line 24 to line 29 increases the variable inductor 51 inductance level decreases causing the signal gain between lines 26 and 24 to decreases at a given frequency.

Figure 8:
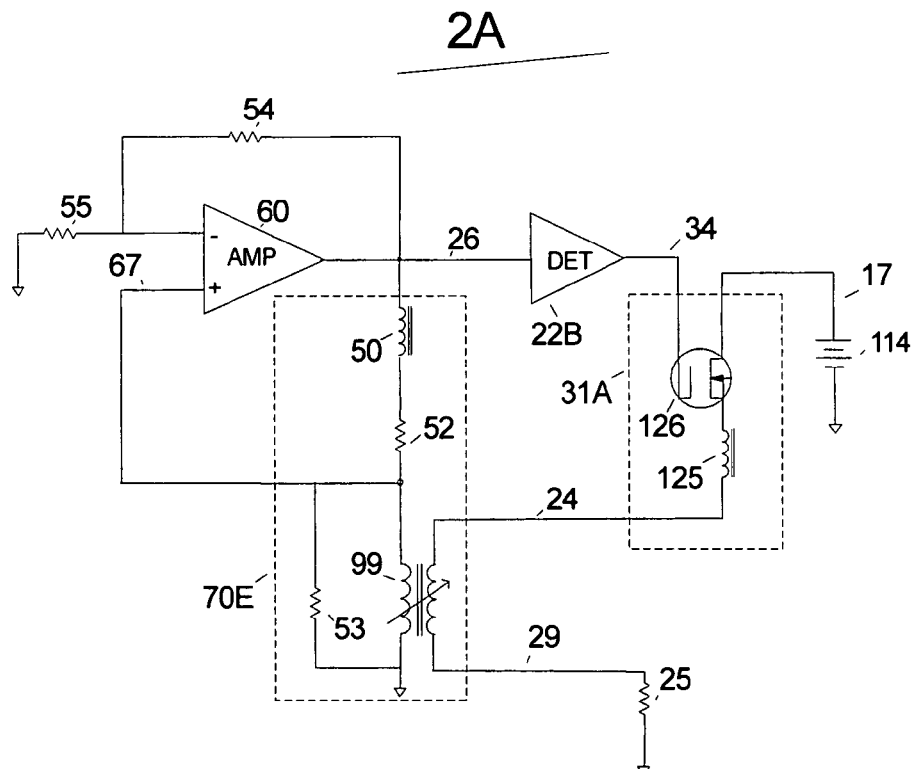
FIG. 8 shows a block diagram of linear current regulator system 2A using variable inductor gain control.

To provide DC voltage isolation to the oscillator 20A gain control input variable inductor 51 may be replaced by variable inductance transformer 99 having the same magnetic properties as shown in FIG. 8. In this case lines 24 and 29 would be connected to the secondary of the transformer and one end of both the resistor 53 and the primary of the transformer would be connected directly to ground.

Figure 5:
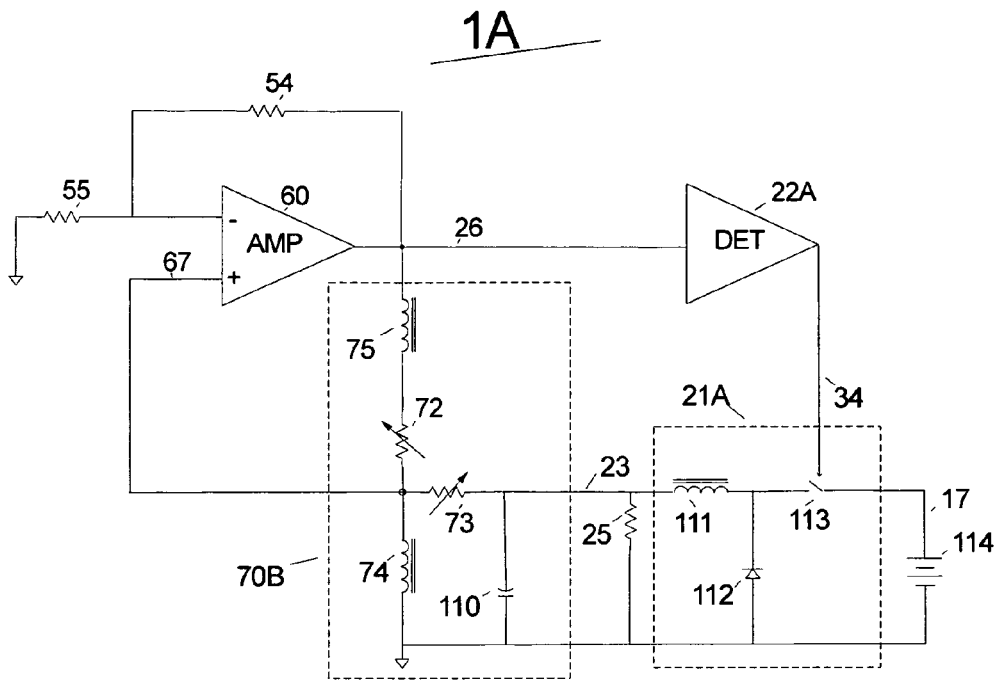
FIG. 5 shows a block diagram of switching voltage regulator system 1A using variable resistors gain control.

FIG. 5 shows a block diagram of an other implementation of voltage regulator system 1, switching voltage regulator system 1A which uses variable resistors for gain control. Switching voltage regulator system 1A is formed by connecting the output of amplifier 60 on line 26 to feedback network 70B, detector 22A input and also to one end of resistor 54. The output of feedback network 70B is connected by line 67 to the non-inverting input of amplifier 60. The inverting input of amplifier 60 is connected to resistor 54 and resistor 55. The other end of resistor 55 is connected to ground. Detector 22A output on line 34 goes to the control input of output control 21A. Output Control 21A output to load resistor 25 is on line 23 and receives power from battery 114 through line 17.

The negative feedback network consist of resistor 54 and resistor 55. The negative signal level gain is controlled by the ratio of resistor 54 to resistor 55. Resistor 54 and resistor 55 have substantially matching temperature coefficients.

Feedback network 70B is formed by connecting one end of inductor 75 to line 26 and the other end to variable resistor 72. The other end of variable resistor 72 is connected to line 67, inductor 74 and to variable resistor 73. The other end inductor 74 is connected to ground. Line 67 is connected by variable resistor 73 to line 23. Line 23 is also connected to load resistor 25, capacitor 110, and output control 21A output. The other end of capacitor 110 and load resistor 25 are also connected to ground.

Feedback network 70B is frequency selective and provides a variable signal level gain between the input and output of the amplifier 60 so as to provide positive feedback. Capacitor 110 has a very low impedance compared to variable resistor 73 at the frequency of oscillation so as to have no substantial effect on the oscillator. Inductor 74 has a very low DC resistance compared to variable resistor 73 so that substantial all the DC voltage on line 23 is applied across variable resistor 73. Inductor 75 and inductor 74 have substantially matching temperature coefficients. Also, variable resistor 72 and variable resistor 73 have substantially matching negative temperature coefficients.

The detector 22A output on line 34 level is high or low depending on whether the oscillator is oscillating or not. For this illustration line 34 is chosen to be low when line 26 has substantially zero AC signal level and be high when the AC signal level is substantially greater than zero.

The output control 21A is formed by connecting one end of relay 113 to line 17 and the other end to diode 112 and inductor 111. It is understood that relay 113 may be replaced by suitable semiconductor device such as transistors. The other end of diode 112 is connected to ground. The other end of inductor 111 is connected to line 23. Diode 112 is connected so as to be reverse biased when relay 113 connects line 17 to inductor 111. When relay 113 disconnects line 17 from inductor 111, diode 112 permits the current through inductor 111 to continue flowing. Inductor 111 and capacitor 110 have high enough values to reduce the switching voltage ripple on line 23 to the desired value. The duty cycle of relay 113 substantially controls the voltage level on line 23. The greater the percentage of time relay 113 connects line 17 to inductor 111 the higher will be the voltage level on line 23. As the voltage level on line 23 increases the resistance level of variable resistor 73 decreases and the oscillator loop gain is decreased. At a certain voltage level the loop gain is reduced enough that oscillation stops and the AC signal level on line 26 becomes substantially zero and relay 113 disconnects line 17 from inductor 111. The voltage level on line 23 now starts to decrease and when it reaches a certain voltage level the loop gain is increased enough that oscillation again starts and the AC signal level on line 26 becomes substantially greater than zero causing relay 113 to again connect line 17 to inductor 111. The voltage level on line 23 now starts to increase again resulting in a substantially constant DC voltage level on line 23.

Figure 6:
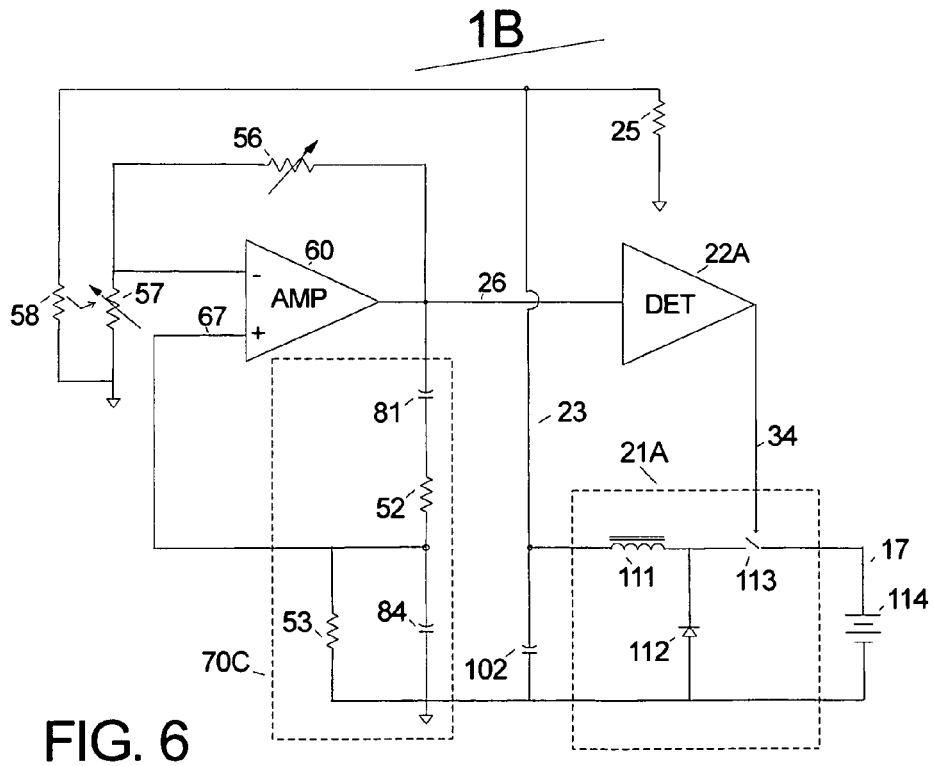
FIG. 6 shows another block diagram of switching voltage regulator system 1B using variable resistors gain control.

FIG. 6 shows a block diagram of an other implementation of voltage regulator system 1, Switching voltage regulator system 1B which uses variable resistors for gain control. Switching voltage regulator system 1B is formed by connecting the output of amplifier 60 on line 26 to feedback network 70C, detector 22A input and also to one end of variable resistor 56. The output of feedback network 70B is connected by line 67 to the non-inverting input of amplifier 60. The inverting input of amplifier 60 is connected to variable resistor 56 and variable resistor 57. The other end of variable resistor 57 is connected to ground. Resistor 58 is thermally coupled to variable resistor 57. Resistor 58, load resistor 25 and capacitor 102 are connected between line 23 and ground. Detector 22A output on line 34 to the control input of output control 21A. Output control 21A output is on line 23 and receives power from battery 114 through line 17.

Feedback network 70C is frequency selective and provides a substantially fixed signal level gain at a given frequency between the input and output of the amplifier 60 so as to provide positive feedback. The negative feedback network consist of variable resistor 56 and variable resistor 57. The negative signal level gain is controlled by the ratio of variable resistor 57 to variable resistor 56. Variable resistor 56 and variable resistor 57 have substantially matching temperature coefficients.

The resistance value of variable resistor 57 is controlled by the temperature of resistor 58. The voltage level on line 23 causes the temperature of resistor 58 to increase above it's ambient temperature. As the temperature of resistor 58 increases the resistance of variable resistor 57 changes. In this example the resistance of variable resistor 57 increase with temperature causing the level of negative feedback to increase. Since variable resistor 56 and variable resistor 57 have substantially matching temperature coefficients the effect of ambient temperature change has substantially no effect on the level of negative feedback. If variable resistor 56 and variable resistor 57 resistance values decrease with temperature, resistor 58 would be thermally coupled to variable resistor 56 to increase the level of negative feedback as resistor 58 temperature increased.

Feedback network 70C is formed by connecting one end of capacitor 81 to line 26 and the other end to resistor 52. The other end of resistor 52 is connected to line 67, capacitor 84 and to resistor 53. The other end capacitor 84 and resistor 53 are connected to ground. Capacitor 81 and capacitor 84 have substantially matching temperature coefficients. Resistor 52 and resistor 53 also have substantially matching temperature coefficients.

Feedback network 70C is frequency selective and provides a substantially constant signal level gain at a given frequency between the input and output of the amplifier 60 so as to provide positive feedback.

The detector 22A output level on line 34 is high or low depending on whether the oscillator is oscillating or not. For this illustration line 34 is chosen to be low when line 26 has substantially zero AC signal level and be high when the AC signal level is substantially greater than zero.

The output control 21A is formed by connecting one end of relay 113 to line 17 and the other end to diode 112 and inductor 111. It is understood that relay 113 may be replaced by suitable semiconductor device such as transistors. The other end of diode 112 connected to ground. The other end of inductor 111 is connected to line 23. Diode 112 is connected so as to be reverse biased when relay 113 connects line 17 to inductor 111. When relay 113 disconnects line 17 from inductor 111, diode 112 permits the current through inductor 111 to continue flowing. Inductor 111 and capacitor 102 have high enough values to reduce the switching voltage ripple on line 23 to the desired value. The duty cycle of relay 113 substantially controls the voltage level on line 23. The greater the percentage of time relay 113 connects line 17 to inductor 111 the higher will be the voltage level on line 23. As the voltage level on line 23 increases the oscillator loop gain is decreased. At a certain voltage level the loop gain is reduced enough that oscillation stops and the AC signal level on line 26 becomes substantially zero and relay 113 disconnects line 17 from inductor 111. The voltage level on line 23 now starts to decrease and when it reaches a certain voltage level the loop gain is increased enough that oscillation starts again and the AC signal level on line 26 becomes substantially greater than zero causing relay 113 to connect line 17 to inductor 111. The voltage level on line 23 now starts to increase again resulting in a substantially constant DC voltage level on line 23.

Figure 7:
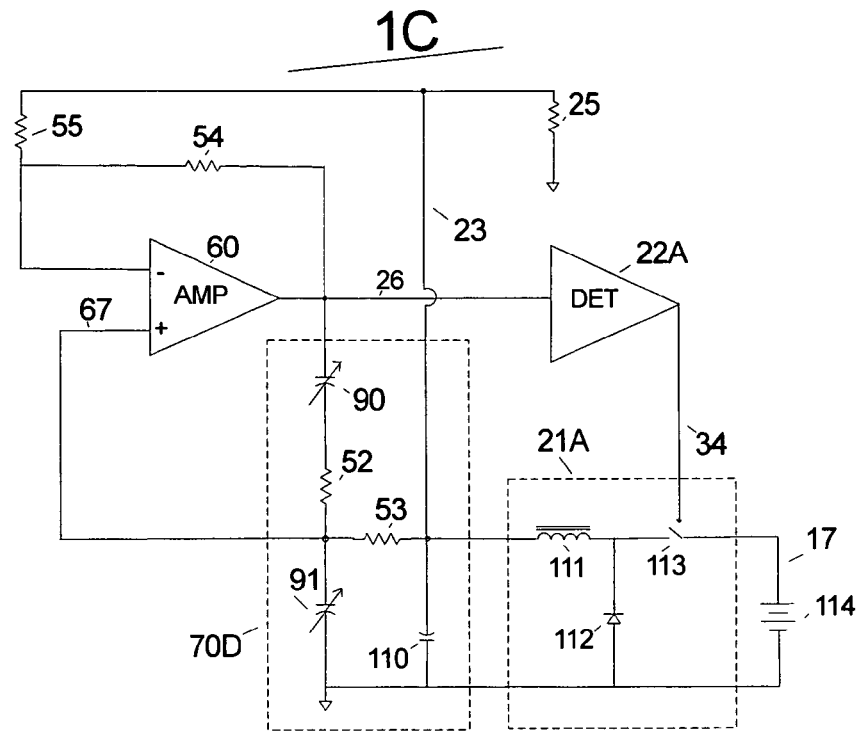
FIG. 7 shows a block diagram of switching voltage regulator system 1C using variable capacitor gain control.

FIG. 7 shows a block diagram of an other implementation of voltage regulator system 1, Switching voltage regulator system 1C which uses variable capacitor for gain control. Switching voltage regulator system 1C is formed by connecting the output of amplifier 60 on line 26 to feedback network 70D, detector 22A input and also to one end of resistor 54. The output of feedback network 70D is connected by line 67 to the non-inverting input of amplifier 60. The inverting input of amplifier 60 is connected to resistor 54 and resistor 55. The other end of resistor 55 is connected to line 23. Detector 22A output on line 34 is connected to the control input of output control 21A. Output control 21A output is on line 23 and receives power from battery 114 through line 17.

The negative feedback network consist of resistor 54 and resistor 55. The negative signal level gain is controlled by the ratio of resistor 55 to resistor 54. Resistor 54 and resistor 55 have substantially matching temperature coefficients.

Feedback network 70D is formed by connecting one end of variable capacitor 90 to line 26 and the other end to resistor 52. The other end of resistor 52 is connected to line 67, variable capacitor 91 and to resistor 53. The other end variable capacitor 91 is connected to ground. Line 67 is connected by resistor 53 to line 23. Line 23 is also connected to load resistor 25, capacitor 110, and output control 21A output. The other end of capacitor 110 and load resistor 25 are also connected to ground.

Feedback network 70D is frequency selective and provides a variable signal level gain between the input and output of the amplifier 60 so as to provide positive feedback. The capacitance of variable capacitor 90 and variable capacitor 91 is varied by the voltage level applied to them. Capacitor 110 has a very low impedance compared to resistor 53 at the frequency of oscillation so as to have no substantial effect on the oscillator. Resistor 53 has a very low DC resistance compared to the input of amplifier 60 so that substantial all the DC voltage on line 23 is applied across variable capacitor 91. Variable capacitor 90 and variable capacitor 91 have substantially matching temperature coefficients. It is understood that instead of using variable capacitor 90 a fixed value capacitor 90 could be used with decreased temperature coefficients matching.

The detector 22A output on line 34 level is high or low depending on whether the oscillator is oscillating or not. For this illustration line 34 is chosen to be low when line 26 has substantially zero AC signal level and be high when the AC signal level is substantially greater than zero.

The output control 21A is formed by connecting one end of relay 113 to line 17 and the other end to diode 112 and inductor 111. It is understood that relay 113 may be replaced by suitable semiconductor device such as transistors. The other end of diode 112 is connected to ground. The other end of inductor 111 is connected to line 23. Diode 112 is connected so as to be reverse biased when relay 113 connects line 17 to inductor 111. When relay 113 disconnects line 17 from inductor 111, diode 112 permits the current through inductor 111 to continue flowing. Inductor 111 and capacitor 110 have high enough values to reduce the switching voltage ripple on line 23 to the desired value. The duty cycle of relay 113 substantially controls the voltage level on line 23. The greater the percentage of time relay 113 connects line 17 to inductor 111 the higher will be the voltage level on line 23. As the voltage level on line 23 increases the capacitance level of variable capacitor 91 increases and the oscillator loop gain is decreased. At a certain voltage level the loop gain is reduced enough that oscillation stops and the AC signal level on line 26 becomes substantially zero and relay 113 disconnects line 17 from inductor 111. The voltage level on line 23 now starts to decrease and when it reaches a certain voltage level the loop gain is increased enough that oscillation start and the AC signal level on line 26 becomes substantially greater than zero causing relay 113 to again connect line 17 to inductor 111. The voltage level on line 23 now starts to increase again resulting in a substantially constant DC voltage level on line 23.

FIG. 8 shows a block diagram of an other implementation of current regulator system 2, linear current regulator system 2A which uses a variable inductor for gain control. Linear current regulator system 2A is formed by connecting the output of amplifier 60 on line 26 to feedback network 70E, detector 22B input and also to one end of resistor 54. The output of feedback network 70E is connected by line 67 to the non-inverting input of amplifier 60. The inverting input of amplifier 60 is connected to resistor 54 and resistor 55. The other end of resistor 55 is connected to ground. Detector 22B output on line 34 goes to the control input of output control 31A. Output Control 31A output is connected to feedback network 70E line 24 and feedback network 70E line 29 is connected to load resistor 25. The other end of load resistor 25 is connected to ground. Output Control 31A receives power from battery 114 through line 17.

The negative feedback network consist of resistor 54 and resistor 55. The negative signal level gain is controlled by the ratio of resistor 55 to resistor 54. Resistor 54 and resistor 55 have substantially matching temperature coefficients.

Feedback network 70E is formed by connecting one end of inductor 50 to line 26 and the other end to resistor 52. The other end of resistor 52 is connected to line 67, one end of both the resistor 53 and the primary of the variable inductance transformer 99. The other end of both the resistor 53 and the primary of the variable inductance transformer 99 are connected to ground. The secondary of the variable inductance transformer 99 is connected to lines 24 and 29. Inductor 50 and variable inductance transformer 99 have substantially matching temperature coefficients. It is understood that inductor 50 and variable inductance transformer 99 may use the same core material.

Feedback network 70E is frequency selective and also provides a variable signal level gain between the input and output of the amplifier 60 so as to provide positive feedback.

The variable inductance transformer 99 inductance level between line 67 and ground is controlled by the level of current flowing on line 24 to line 29. The variable inductance transformer 99 magnetic core material "μ" decreases as current increases causing it's inductance level to decrease. As the current flowing on line 24 to line 29 increases variable inductance transformer 99 inductance level decreases causing the signal gain to decreases at a given frequency between Feedback network 70E input line 26 and output line 67.

The detector 22B output on line 34 is proportional to the AC signal level on line 26. As the AC signal level on line 26 increases the detector 22B output on line 34 increases.

The output control 31A is formed by connecting one end of transistor 126 to line 17 and the other end to inductor 125. The transistor gate is connected to line 34. As the signal level on line 34 increases transsistor 126 turns further on allowing more current to pass through it. The other end of inductor 125 is connected to line 24. Inductor 125 has a high enough impedance at the frequency of oscillation so as to prevent load 25 and the impedance of output control 21B from having any substantial effect on the oscillator.

In effect the current level flowing on line 24 to line 29 is applied as negative feedback to maintain a relatively low AC signal level on line 26 which occurs at a loop gain value at or very close to one. The current level flowing on line 24 to line 29 is of a value that just maintains oscillation. The output control 31 DC output current level flowing on line 24 to line 29 therefore remains substantially a constant value.

Having described embodiments of a new and improved system for producing constant level output signals constructed in accordance with the invention, it is believed obvious that numerous modifications and variations of the invention will be suggested to those skilled in the art in the light of the above teachings. It is therefore to be understood that changes may be made in the particular embodiment of the invention described which are within the full intended scope of the invention as defined by the appended claims.

What is claimed is:

1. A regulator system producing a constant level DC output signal, comprising: oscillator having loop gain level responsive to said DC output signal level; said oscillator producing an AC output signal with said AC output signal level responsive to said loop gain level; output control responsive to said AC output signal level; said output control controlling said DC output signal level; said loop gain level is controlled by signal controlled variable impedance device responsive to said DC output signal; and negative feedback of said DC output signal level variation causing variation in said loop gain level so as to just maintain oscillation causing said output control to provide a constant DC output signal level.

2. A regulator system as set forth in claim 1, wherein said oscillator loop gain level is controlled by variable capacitor responsive to said DC output signal.

3. A regulator system as set forth in claim 1, wherein said oscillator loop gain level is controlled by variable resistor responsive to a said DC output signal.

4. A regulator system as set forth in claim 1, wherein said oscillator loop gain level is controlled by variable inductor responsive to said DC output signal.

5. A regulator system producing a constant level DC output signal, comprising: oscillator having loop gain level responsive to said DC output signal level; said oscillator producing an AC output signal with said AC output signal level responsive to said loop gain level; output control controlling said DC output signal level; said output control having controlled duty cycle apparatus; said duty cycle of said apparatus responsive to said AC output signal level; said loop gain level is controlled by signal controlled variable impedance device responsive to said DC output signal; and negative feedback of said DC output signal level variation causing variation in said loop gain level so as to cause stop and start of oscillation causing said output control to provide a constant DC output signal level.

6. A regulator system as set forth in claim 5, wherein said oscillator loop gain level is controlled by variable capacitor responsive to said DC output signal.

7. A regulator system as set forth in claim 5, wherein said oscillator loop gain level is controlled by variable resistor responsive to said DC output signal.

8. A regulator system as set forth in claim 5, wherein said oscillator loop gain level is controlled by variable inductor responsive to said DC output signal.

9. A regulator system producing a constant level DC output signal, comprising: oscillator having loop gain level responsive to said DC output signal level; said oscillator producing an AC output signal with said AC output signal level responsive to said loop gain level; output control responsive to said AC output signal level; said output control controlling said DC output signal level; said loop gain level is controlled by signal controlled variable gain devices responsive to said DC output signal; and negative feedback of said DC output signal level variation causing variation in said loop gain level so as to just maintain oscillation causing said output control to provide a constant DC output signal level.

\* \* \* \* \*